(12) United States Patent
Taniguchi (10) Patent No.: US 9,177,962 B2
(45) Date of Patent: Nov. 3, 2015

(54) SEMICONDUCTOR DEVICE (71) Applicant: PS4 Luxco S.a.r.l., Luxembourg (LU)

(72) Inventor: Koji Taniguchi, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/422,672

(22) PCT Filed: Aug. 19, 2013

(86) PCT No.: PCT/JP2013/072067
§ 371 (c)(1),
(2) Date: Feb. 19, 2015

(87) PCT Pub. No.: WO2014/030604
PCT Pub. Date: Feb. 27, 2014

(65) Prior Publication Data
US 2015/0228658 A1 Aug. 13, 2015

(30) Foreign Application Priority Data

Aug. 20, 2012 (JP) ................ 2012-181799

(51) Int. Cl.
*H01L 27/088* (2006.01)
*H01L 27/108* (2006.01)
*H01L 29/06* (2006.01)
*G11C 8/14* (2006.01)

(52) U.S. Cl.
CPC ............ *H01L 27/10897* (2013.01); *G11C 8/14* (2013.01); *H01L 29/0619* (2013.01)

(58) Field of Classification Search
None
See application file for complete search history.

(56) References Cited

U.S. PATENT DOCUMENTS

| 6,954,371 | B2* | 10/2005 | Hokari et al. ................. 365/149 |
| 7,145,792 | B2* | 12/2006 | Hokari et al. ................. 365/149 |
| 2005/0024949 | A1 | 2/2005 | Hokari et al. |
| 2005/0281110 | A1 | 12/2005 | Hokari et al. |
| 2009/0009732 | A1 | 1/2009 | Maeda et al. |
| 2011/0189830 | A1 | 8/2011 | Oshima |
| 2012/0043642 | A1 | 2/2012 | Kuroki |

FOREIGN PATENT DOCUMENTS

| JP | 08-306911 A | 11/1996 |
| JP | 09-064310 A | 3/1997 |
| JP | 09-102592 A | 4/1997 |
| JP | 11-017018 A | 1/1999 |
| JP | 2002-134506 A | 5/2002 |
| JP | 2005-051044 A | 2/2005 |
| JP | 2008-235296 A | 10/2008 |
| JP | 2011-159760 A | 8/2011 |
| JP | 2012-043995 A | 3/2012 |

OTHER PUBLICATIONS

International Search Report (ISR) (PCT Form PCT/ISA/210), in PCT/JP2013/072067, dated Oct. 1, 2012.

* cited by examiner

*Primary Examiner* — Jack Chen
(74) *Attorney, Agent, or Firm* — Kunzler Law Group, PC (57) ABSTRACT

Provided is a semiconductor device wherein chip size is reduced, while potential on the dummy word lines is fixed. The semiconductor device is provided with: a memory cell array including a plurality of memory cells, a plurality of word lines for controlling memory operations of the plurality of memory cells, and a plurality of dummy word lines that do not participate in memory operations of the plurality of memory cells; and a guard ring surrounding the memory cell array. The plurality of dummy word lines are electrically fixed to the guard ring.

4 Claims, 10 Drawing Sheets

SEMICONDUCTOR DEVICE

NOTICE REGARDING RELATED APPLICATION

The present invention is based upon the priority claim of Japanese Patent Application No. 2012-181799 (filed on Aug. 20, 2012), the disclosure of which is incorporated herein in its entirety by reference thereto.

TECHNICAL FIELD

The present invention relates to a semiconductor device. In particular it relates to a semiconductor device provided with embedded word lines.

BACKGROUND ART

There are constant demands for reductions in the chip size of semiconductor devices, a typical example being DRAM (Dynamic Random Access Memory). In order to reduce the chip size, embedded gate type transistors in which the gate electrodes are embedded in the surface layer of a semiconductor substrate are sometimes used as selection transistors constituting a memory cell. The gate electrode of such an embedded gate type transistor is disposed as a word line used to select a memory cell.

Further, in order to maintain the process conditions within a memory cell array, dummy word lines are sometimes provided in addition to the word lines actually used to control the memory cells. Providing dummy word lines at fixed intervals makes the density of word lines constant.

In addition, a guard ring for protecting the memory cell array from external noise is sometimes provided at the periphery of the memory cell array.

Here, patent literature article 1 discloses a technique whereby a guard ring is provided three-dimensionally in order to block noise that propagates to circuits on the semiconductor substrate. Also, patent literature article 2 discloses a power MOSFET in which the breakdown voltage is increased by providing a plurality of guard ring regions. Further, patent literature article 3 discloses a fuse device provided with a guard ring.

PRIOR ART LITERATURE

Patent literature

Patent literature article 1: JP 2008-235296 A
Patent literature article 2: JP 08-306911 A
Patent literature article 3: JP 11-017018 A

SUMMARY OF THE INVENTION

Problems to be Resolved by the Invention

It should be noted that each of the disclosures in the abovementioned prior art literature is incorporated herein by reference. The following analysis is performed from the viewpoint of the present invention.

As discussed hereinabove, a memory cell array is sometimes provided with dummy word lines. It is not sufficient for these dummy word lines simply to be provided within the memory cell array, and from the point of view of circuit stability and resistance to noise they are preferably fixed to a constant electric potential.

Accordingly, upon considering the layout when dummy word lines are wired to the memory cell array, the inventors devised bundling the dummy word lines in a poly/metal wiring layer in a boundary region between the memory cell array and a sub-word driver adjacent to the memory cell array.

Figure 2:
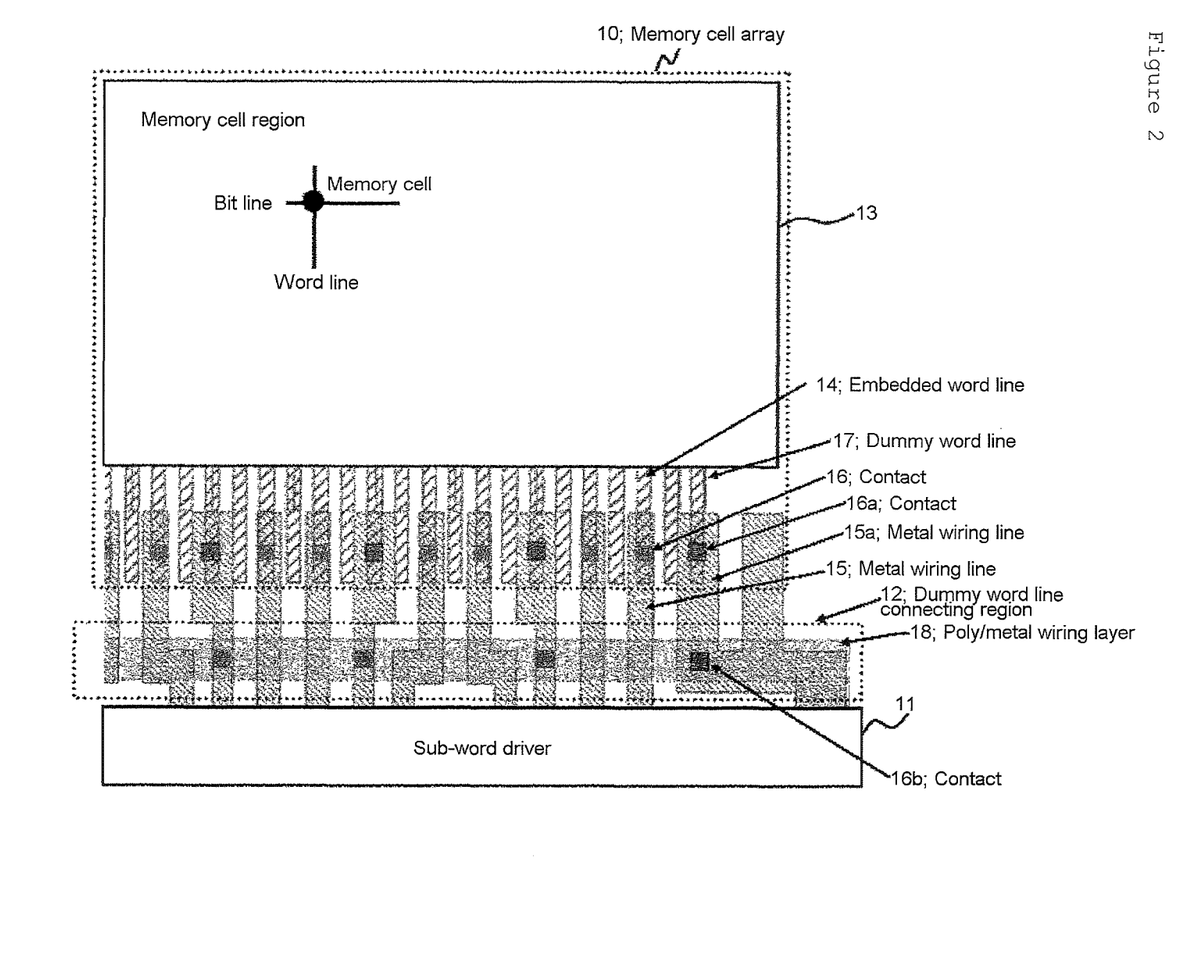
FIG. 2 is a drawing illustrating an example of the layout of a semiconductor device.

FIG. 2 is a drawing illustrating an example of the layout of a semiconductor device. FIG. 2 illustrates a wiring example in which dummy word lines are bundled in a dummy word line connecting region 12, which is a boundary region between a memory cell array 10 and a sub-word driver 11. A memory cell region 13 consisting of a plurality of memory cells is included in the memory cell array 10 shown in FIG. 2. The memory cell region 13 and the sub-word driver 11 are connected by means of a plurality of embedded word lines 14. For example, an embedded word line 14 (a gate electrode of an embedded type transistor) and a metal wiring line 15 are connected by means of a contact 16.

On the other hand, a dummy word line 17 is connected to a poly/metal wiring layer 18 by means of a metal wiring line 15a and contacts 16a and 16b. It should be noted that in FIG. 2, dummy word lines 17 are provided at intervals of five embedded word lines 14.

Bundling the dummy word lines 17 in this way in a boundary region between the memory cell array 10 and the sub-word driver 11 necessitates the provision of a dummy word line connecting region 12, which would not originally have been required. As a result, the boundary region between the memory cell array 10 and the sub-word driver 11 is enlarged, contrary to the desire for a reduction in the chip size of the semiconductor device. A semiconductor device in which the chip size is reduced while at the same time the electric potential of the dummy word lines is fixed is thus desirable.

Means of Overcoming the Problems

A first aspect of the present invention provides a semiconductor device comprising a memory cell array including a plurality of memory cells, a plurality of word lines which control storage operations of the abovementioned plurality of memory cells, and a plurality of dummy word lines which do not contribute to the storage operations of the abovementioned plurality of memory cells, and a guard ring surrounding the abovementioned memory cell array, the abovementioned plurality of dummy word lines being electrically fixed to the abovementioned guard ring.

Advantages of the Invention

According to the first aspect of the present invention there is provided a semiconductor device in which the chip size is reduced while at the same time the electric potential of the dummy word lines is fixed.

MODES OF EMBODYING THE INVENTION

One mode of embodiment will first be described in outline with reference to FIG. 1. It should be noted that the drawing reference codes appended in this outline are appended to each element for convenience, as examples to aid understanding, and the present invention is not intended to be limited to the modes of embodiment illustrated in the drawings.

As discussed hereinabove, the electric potential of the dummy word lines within a memory cell array must be fixed. Here, bundling the dummy word lines in a boundary region between a memory cell array and a sub-word driver results in an enlargement of the chip size of the semiconductor device. A semiconductor device in which the chip size is reduced while at the same time the electric potential of the dummy word lines is fixed is thus desirable.

Figure 1:
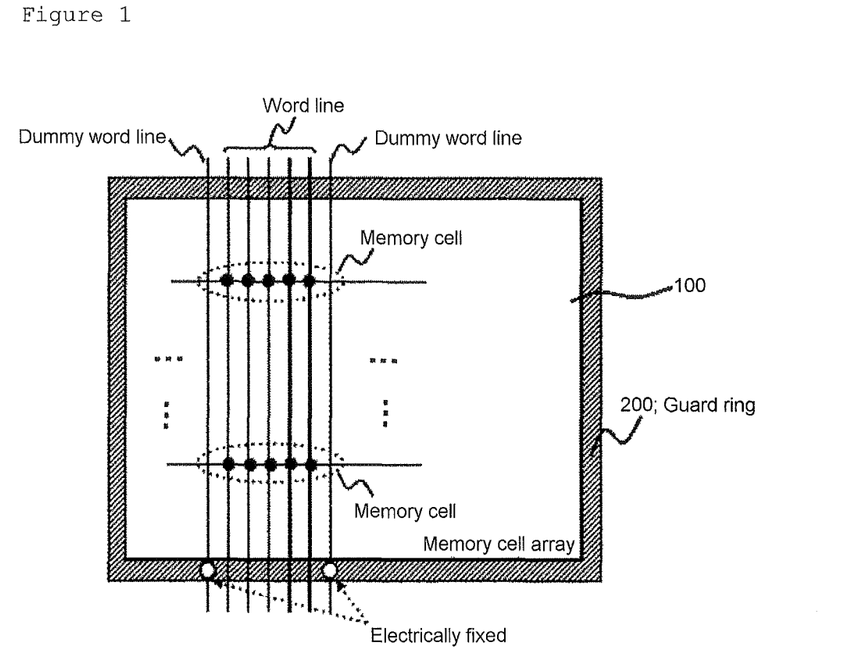
FIG. 1 is a drawing used to explain in outline one mode of embodiment.

Accordingly, the semiconductor device illustrated in FIG. 1 is provided as one example. The semiconductor device illustrated in FIG. 1 comprises a memory cell array 100 including a plurality of memory cells, a plurality of word lines which control storage operations of the plurality of memory cells, and a plurality of dummy word lines which do not contribute to the storage operations of the plurality of memory cells, and a guard ring 200 surrounding the memory cell array 100, the plurality of dummy word lines being electrically fixed to the guard ring 200.

In other words, by connecting the dummy word lines and the guard ring 200, the electric potential of the dummy word lines is made to be the same as the electric potential of the guard ring 200. As a result, wiring lines supplying an electric potential to the dummy word lines are not required in the boundary section between the memory cell array 100 and the sub-word driver (which is not shown in FIG. 1), and this contributes to reducing the chip size of the semiconductor device by reducing the surface area of the boundary section.

It should be noted that the guard ring 200 surrounding the memory cell array 100 includes a condition in which the guard ring 200 encompasses the memory cell array 100 (the condition illustrated in FIG. 1), and a condition in which a portion of the memory cell array 100 is in contact with a portion outside the guard ring 200 (a condition in which part of the guard ring 200 is missing).

Further, the following modes are possible.

[Mode 1] This is in line with the semiconductor device according to the abovementioned first aspect.

[Mode 2] The abovementioned plurality of word lines and the abovementioned plurality of dummy word lines are preferably disposed as gate electrodes of embedded gate type transistors formed on a semiconductor substrate.

[Mode 3] The abovementioned guard ring is preferably formed by means of a diffusion layer surrounding the abovementioned memory cell array.

[Mode 4] The abovementioned guard ring is preferably a wiring line guard ring in which the periphery of the abovementioned memory cell array is surrounded by a metal wiring line.

Specific embodiments will now be described in more detail with reference to the drawings.

First Mode of Embodiment

A first mode of embodiment will be described in more detail with reference to the drawings.

A semiconductor device will first be described in outline.

Figure 3:
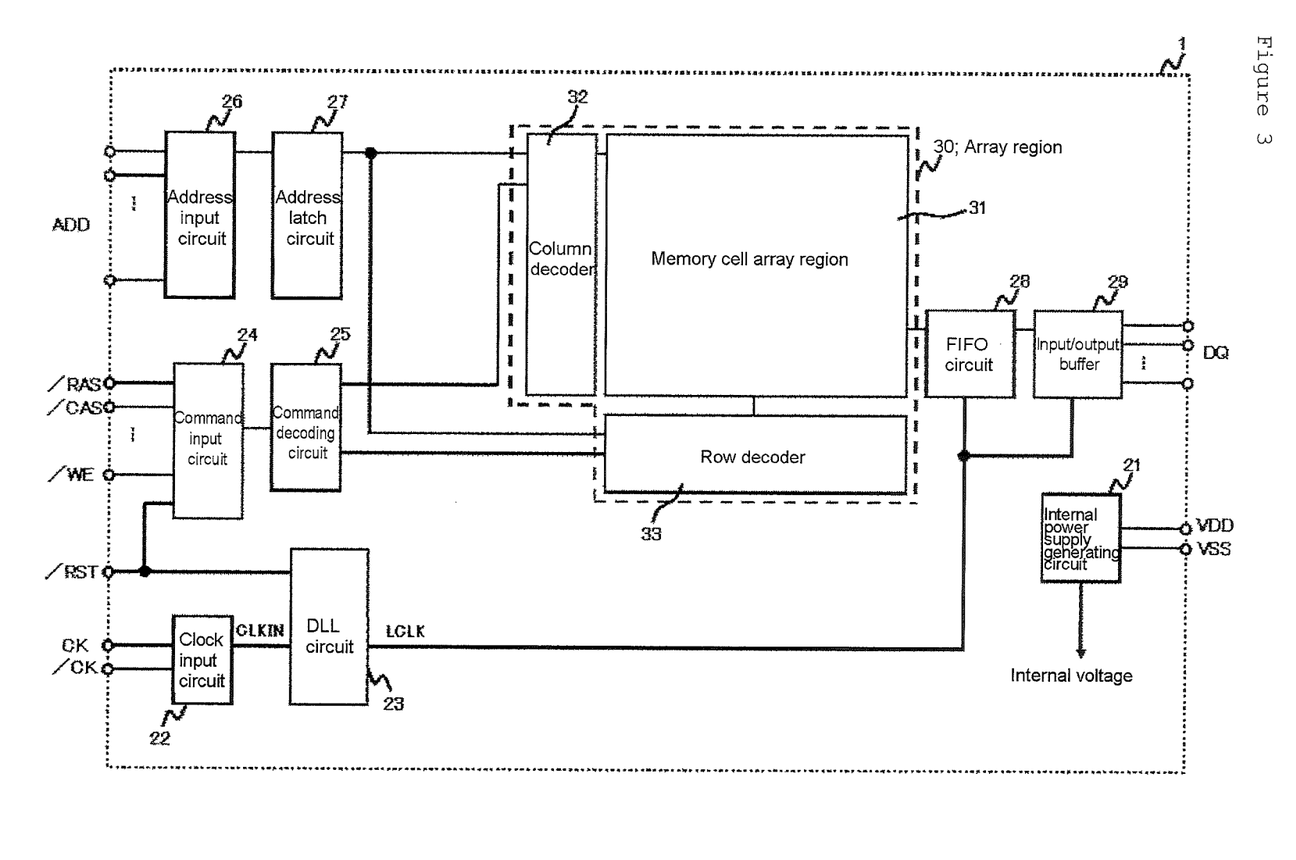
FIG. 3 is a drawing illustrating an example of the overall configuration of a semiconductor device 1 according to a first mode of embodiment.

FIG. 3 is a drawing illustrating an example of the overall configuration of a semiconductor device 1 according to this mode of embodiment. The semiconductor device 1 is provided with terminals such as command terminals (/RAS, /CAS, /WE), a reset terminal (/RST), address terminals ADD, power supply terminals (VDD, VSS), clock terminals (CK, /CK) and data terminals DQ.

The semiconductor device 1 illustrated in FIG. 3 consists of an internal power supply generating circuit 21, a clock input circuit 22, a DLL circuit 23, a command input circuit 24, a command decoding circuit 25, an address input circuit 26, an address latch circuit 27, a FIFO circuit 28, an input/output buffer 29 and an array region 30.

The internal power supply generating circuit 21 generates a voltage for use in the semiconductor device 1.

The clock input circuit 22 receives a differential clock (CK, /CK) and outputs a single-phase clock CLKIN.

The DLL circuit 23 generates an internal clock LCLK by delaying the single-phase clock CLKIN.

Commands for the semiconductor device 1 are received by the command input circuit 24 via the command terminals. More specifically, commands consisting for example of a row address strobe signal /RAS, a column address strobe signal /CAS and a write enable signal /WE are input. Commands consisting of these signals are decoded by the command decoding circuit 25, the result of the decoding being output to the array region 30.

Address signals issued from outside are received by the address input circuit 26 and are latched by the address latch circuit 27. Address signals are supplied to a column decoder 32 and a row decoder 33 within the array region 30.

The array region 30 contains a memory cell array region 31, the column decoder 32 and the row decoder 33. The memory cell array region 31 contains a plurality of memory cell arrays arranged in a matrix. The column decoder 32 decodes a column address from the address signal, and selects a bit line of the memory cell to be accessed. The row decoder 33 decodes a row address from the address signal, and selects a word line.

During a data read operation, read data that have been read from the selected memory cell are output from the data terminals DQ via the FIFO circuit 28 and the input/output buffer 29. During a data write operation, write data that have been input into the data terminals DQ are written to the selected memory cell via the input/output buffer 29 and the FIFO circuit 28.

The memory cell array region 31 will now be described. The memory cell array region 31 contains a plurality of memory cell arrays, and sub-word drivers corresponding to the memory cell arrays.

Figure 4:
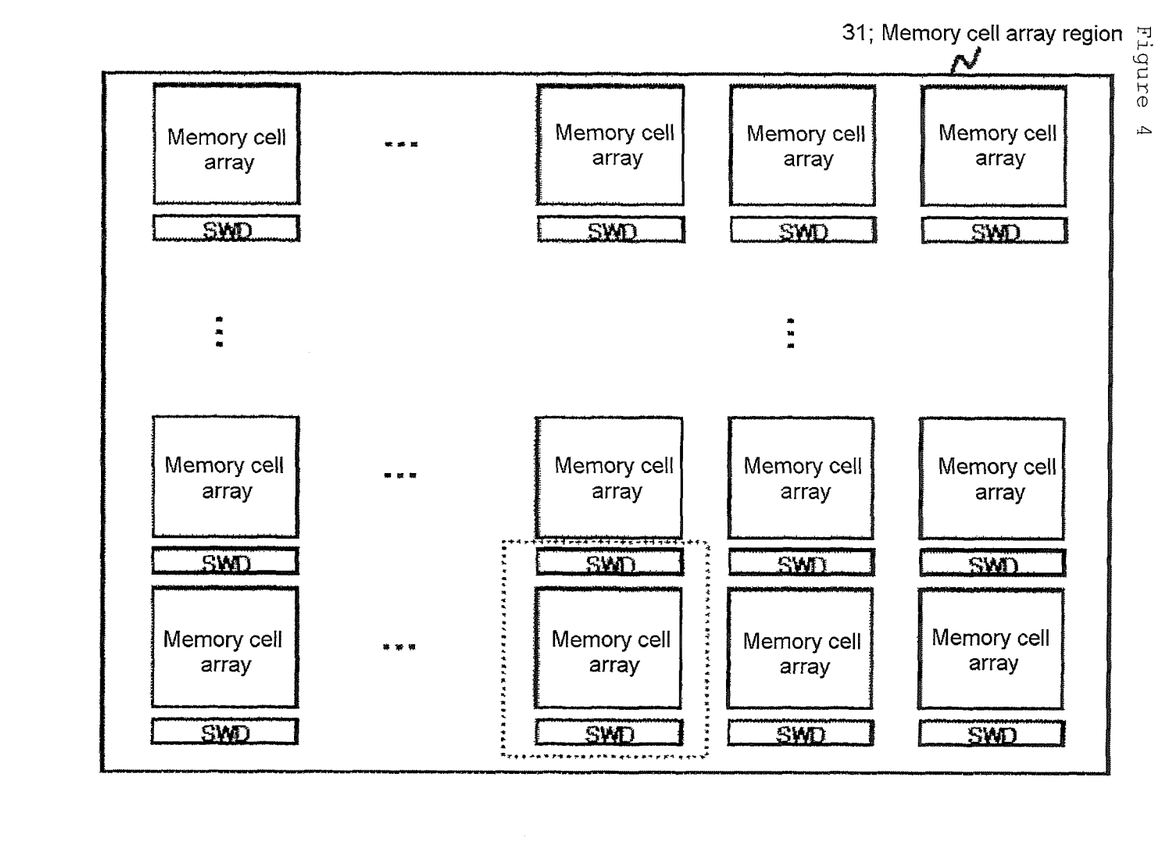
FIG. 4 is a drawing illustrating an example of the layout of the memory cell array region 31 illustrated in FIG. 3.

FIG. 4 is a drawing illustrating an example of the layout of the memory cell array region 31. A memory cell array consists of a prescribed plurality of memory cells grouped together, a sub-word driver being connected corresponding to each memory cell array.

Figure 5:
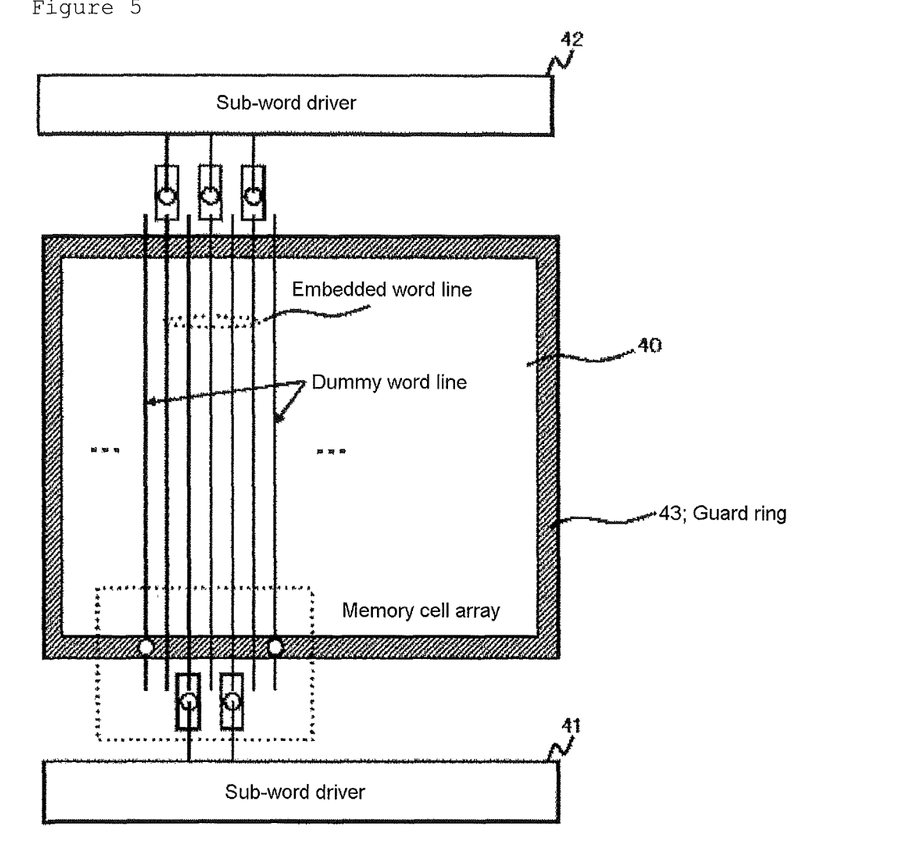
FIG. 5 is an enlargement of the region enclosed by the dotted lines in FIG. 4.

FIG. 5 is an enlargement of the region enclosed by the dotted lines in FIG. 4. As illustrated in FIG. 5, a memory cell array 40 contains a plurality of embedded word lines (embedded sub-word lines). Each embedded word line is connected to sub-word drivers 41 and 42 adjacent to the memory cell array 40. Further, dummy word lines are wired into the memory cell array 40 at fixed intervals. In FIG. 5, dummy word lines are provided in a proportion of one dummy word line for five embedded word lines. It should be noted that the memory cell array 40 also contains a plurality of bit lines, but these have been omitted from FIG. 5.

The memory cell array 40 is surrounded by a guard ring 43.

Figure 6:
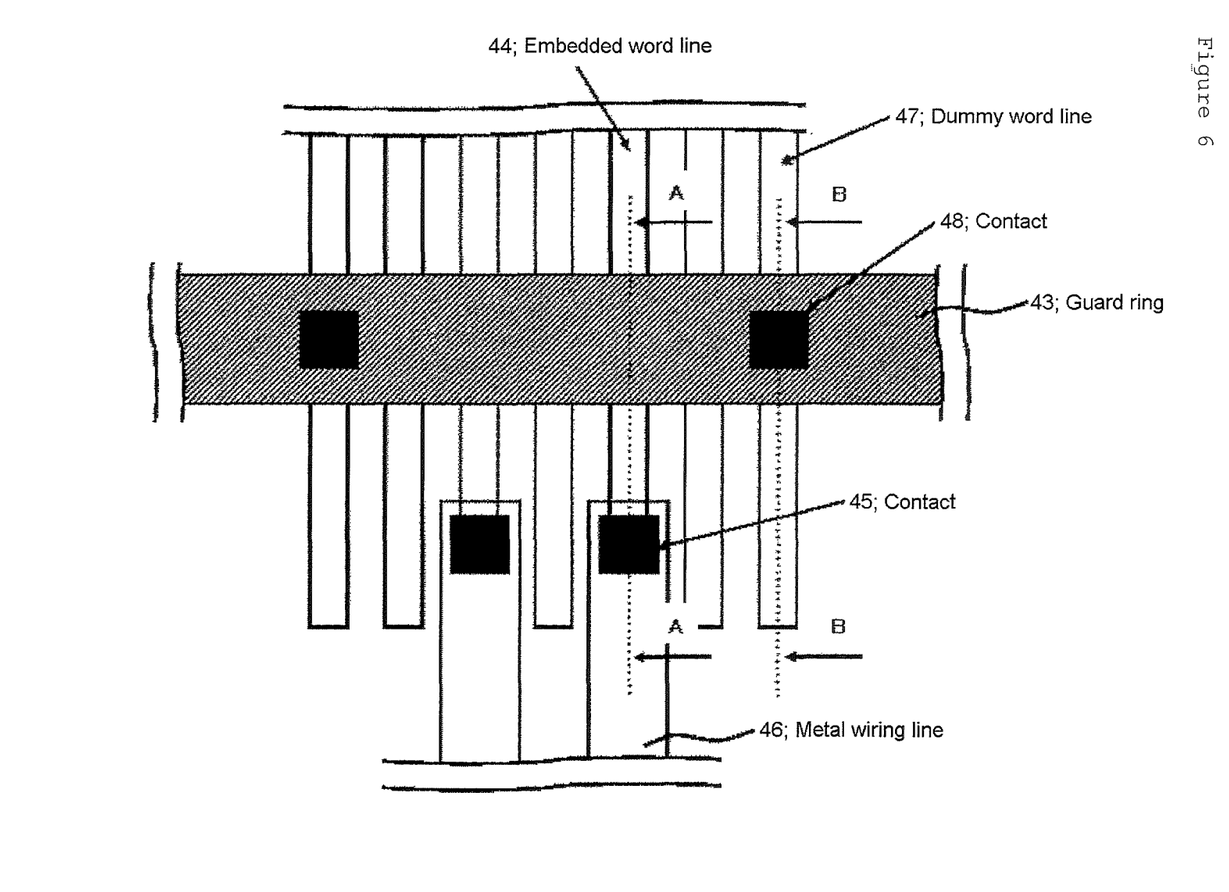
FIG. 6 is an enlargement of the region enclosed by the dotted lines in FIG. 5.

FIG. 6 is an enlargement of the region enclosed by the dotted lines in FIG. 5. The embedded word line 44 illustrated in FIG. 6 is connected to a metal wiring line 46 by means of a contact 45. On the other hand, the dummy word line 47 is connected to the guard ring 43 by means of a contact 48.

Figure 7:
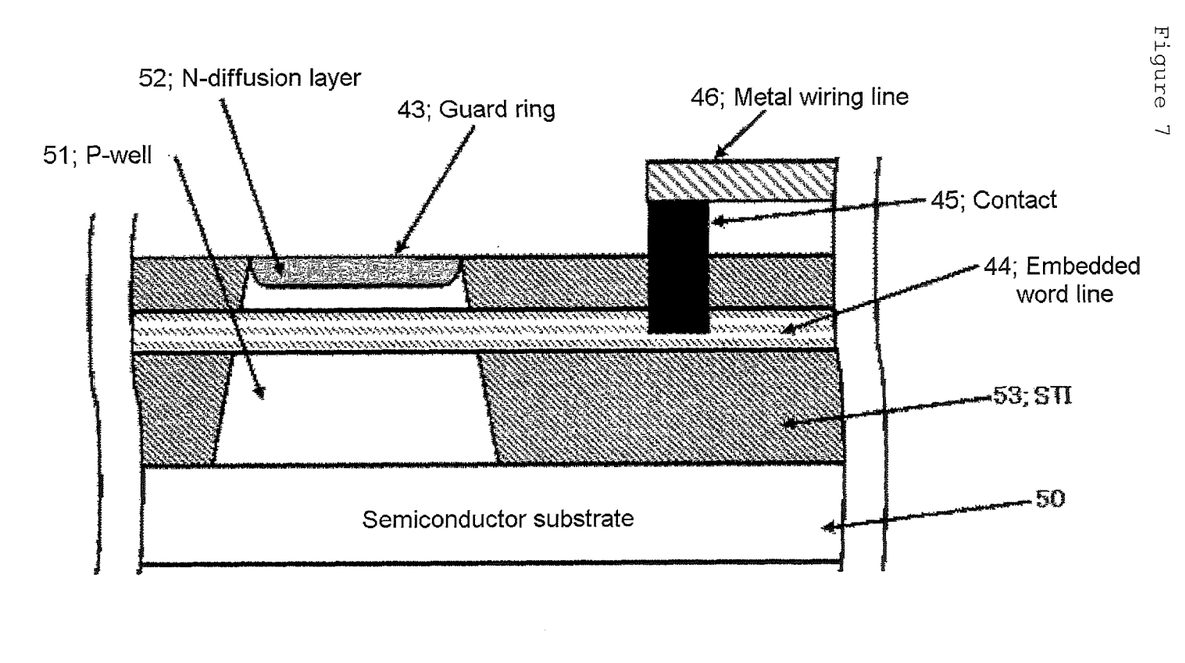
FIG. 7 is a drawing illustrating an example of a section through A-A in FIG. 6.

FIG. 7 is a drawing illustrating an example of a section through A-A in FIG. 6. In FIG. 7, a P-well 51 is formed in the surface of a semiconductor substrate 50, and an N-diffusion layer 52 is laminated thereon. The guard ring 43 (diffusion layer guard ring) is configured by means of the P-well 51 and the N-diffusion layer 52. Further, the guard ring 43 is demarcated by means of an STI (shallow trench isolation) 53. Further, a transistor gate electrode is disposed in the P-well 51 and the STI 53 as an embedded word line 44. The embedded word line 44 is connected to the metal wiring line 46 by means of the contact 45.

Figure 8:
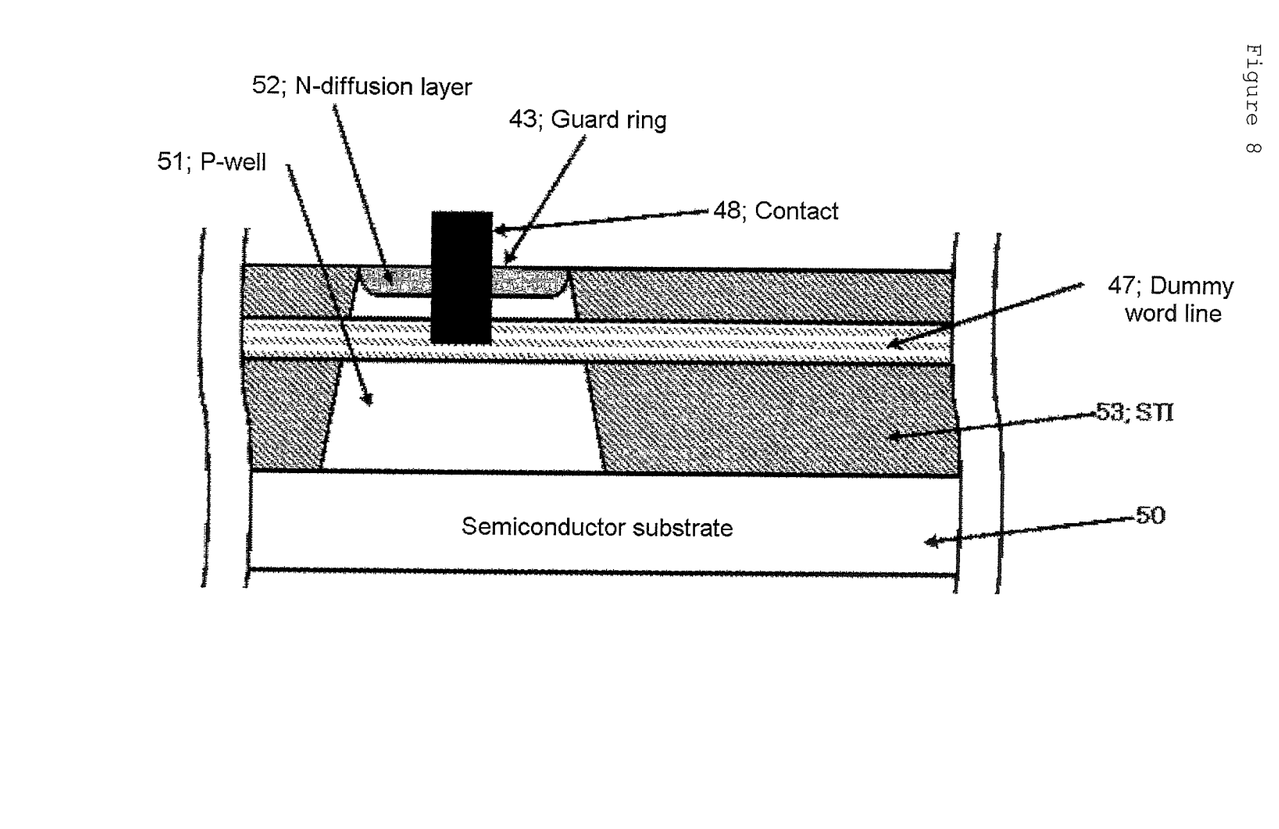
FIG. 8 is a drawing illustrating an example of a section through B-B in FIG. 6.

FIG. 8 is a drawing illustrating an example of a section through B-B in FIG. 6. In contrast to FIG. 7, in FIG. 8 the dummy word line 47 is connected to the P-well 51 of the guard ring 43 by means of the contact 48. The electric potential of the dummy word line 47 connected to the P-well 51 is thus fixed to the electric potential of the P-well 51. In this way, by connecting a dummy word line via a contact 48 to a guard ring 43 (diffusion layer guard ring) disposed at the periphery of a memory cell array, the electric potential of the dummy word line can be fixed.

As a result, the region required when dummy word lines are bundled in a boundary region between the memory cell array and the sub-word driver is no longer required (the dummy word line connecting region 12 in FIG. 2 is not required). By reducing the surface area of the boundary region between the memory cell array and the sub-word driver it is possible to reduce the chip size of the semiconductor device 1.

Second Mode of Embodiment

A second mode of embodiment will next be described in detail with reference to the drawings. There are no differences between the overall configuration and the like of the semiconductor device 2 according to the present mode of embodiment and the semiconductor device 1, so a description of FIG. 3 to FIG. 6 relating to the semiconductor device 2 will be omitted. The point of difference between the semiconductor device 1 and the semiconductor device 2 lies in the fact that instead of implementing the guard ring 43 using a diffusion layer guard ring, the guard ring is implemented using a wiring line guard ring in which the periphery of the memory cell array is surrounded by a metal wiring line.

Figure 9:
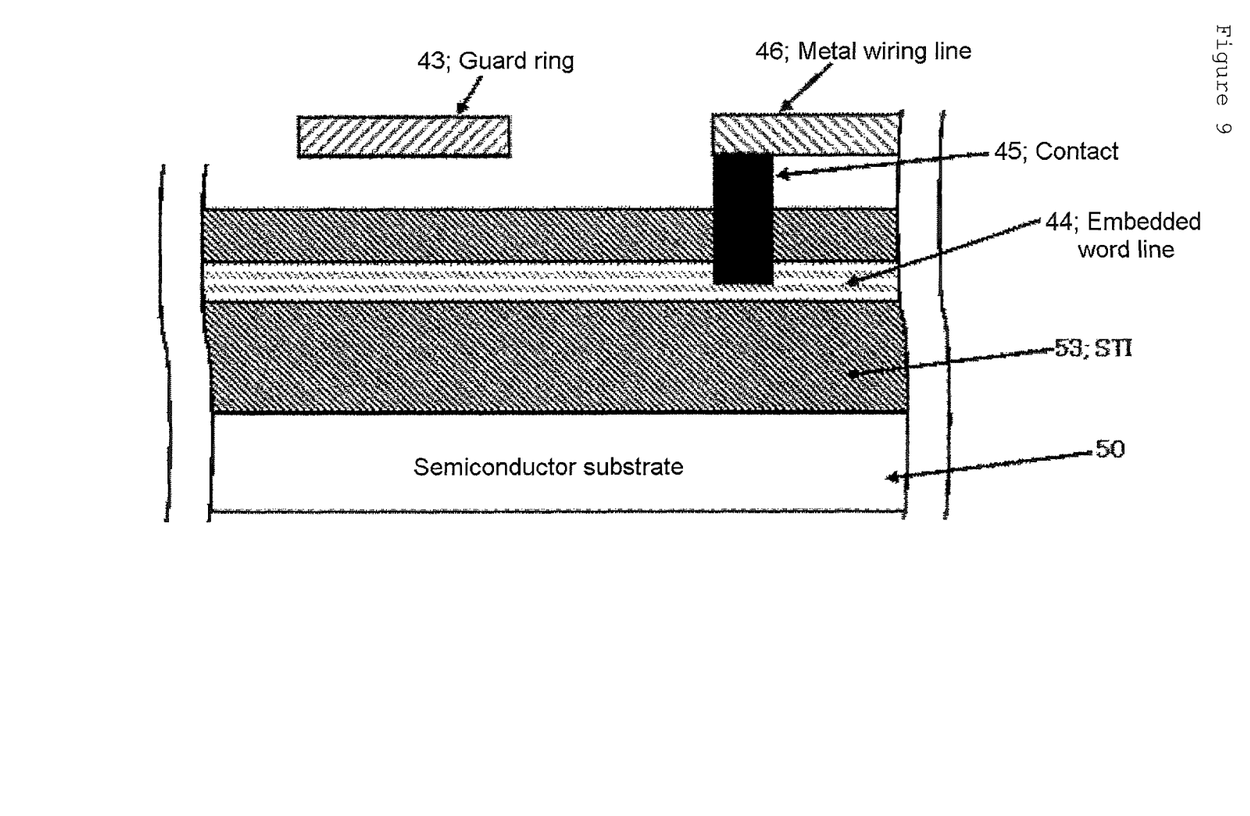
FIG. 9 is a drawing illustrating an example of a section through A-A in FIG. 6.
Figure 10:
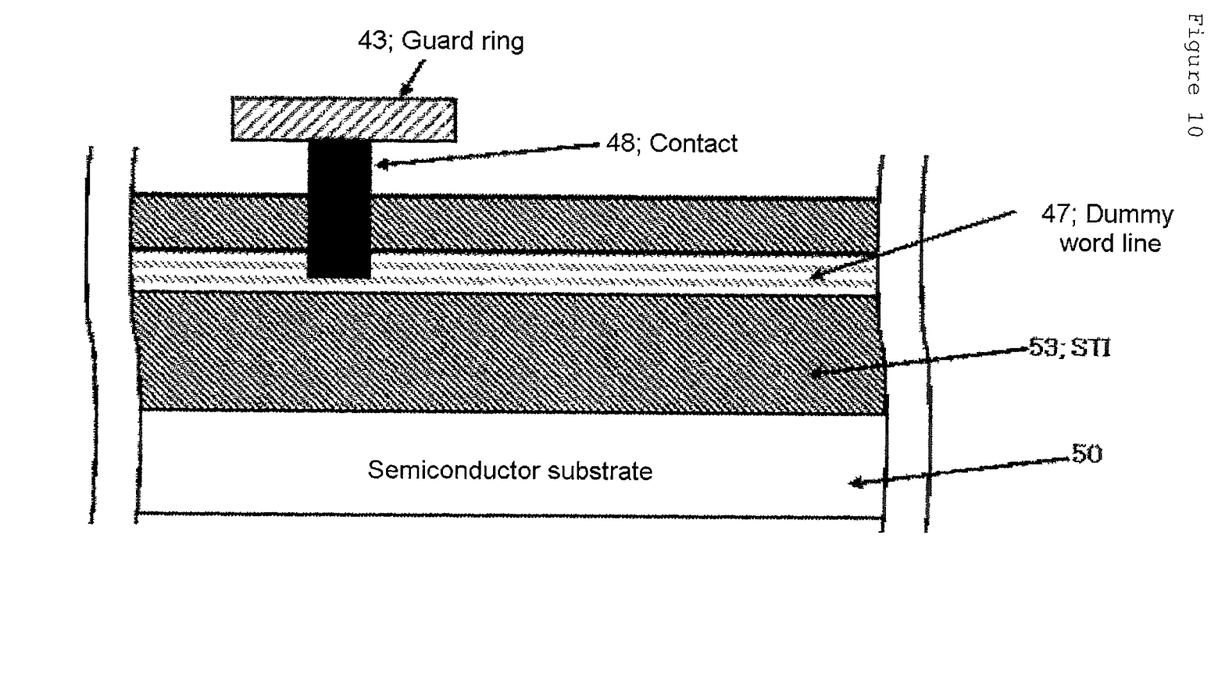
FIG. 10 is a drawing illustrating an example of a section through B-B in FIG. 6.

FIG. 9 is a drawing illustrating an example of a section through A-A in FIG. 6. FIG. 10 is a drawing illustrating an example of a section through B-B in FIG. 6. In FIG. 9 and FIG. 10 the same reference codes are appended to constituent elements that are the same as in FIG. 7 and FIG. 8, and a description thereof is omitted.

As illustrated in FIG. 10, if a wiring line guard ring is used as the guard ring 43, the electric potential of the dummy word line 47 can be fixed by connecting the dummy word line 47 to the guard ring 43 (wiring line guard ring) by means of a contact 48. It should be noted that the embedded word line 44 is connected to the metal wiring line 46 by means of a contact 45, in the same way as in FIG. 7.

As a result, by reducing the surface area of the boundary region between the memory cell array and the sub-word driver it is possible to reduce the chip size of the semiconductor device 2.

It should be noted that each of the disclosures in the above-mentioned cited patent literature is incorporated herein by reference. Within the framework of the entire disclosure of the present invention (including the scope of the claims), and on the basis of its basic technical concepts, modifications and adjustments may be made to the modes of embodying the invention and to embodiments thereof. Further, various combinations of or selections from the various disclosed elements (including for example each element of each claim, each element of each embodiment, and each element of each drawing) are possible within the framework of the scope of the claims in the present invention. In other words, it goes without saying that the present invention includes various variations and modifications that could be arrived at by one skilled in the art in accordance with the entire disclosure and technical concepts therein, including the scope of the claims. In particular, with regard to ranges of numerical values set forth herein, arbitrary numerical values or sub-ranges contained within said ranges should be interpreted as being specifically set forth, even if not otherwise set forth.

EXPLANATION OF THE REFERENCE NUMBERS 1, 2 Semiconductor device
10, 40, 100 Memory cell array
11, 41, 42 Sub-word driver
12 Dummy word line connecting region
13 Memory cell region
14, 44 Embedded word line
15, 15a, 46 Metal wiring line
16, 16a, 16b, 45, 48 Contact
17, 47 Dummy word line
18 Poly/metal wiring layer
21 Internal power supply generating circuit
22 Clock input circuit
23 DLL circuit
24 Command input circuit
25 Command decoding circuit
26 Address input circuit
27 Address latch circuit
28 FIFO circuit
29 Input/output buffer
30 Array region
31 Memory cell array region
32 Column decoder
33 Row decoder
43, 200 Guard ring
50 Semiconductor substrate
51 P-well
52 N-diffusion layer
53 STI

The invention claimed is:
1. A semiconductor device comprising:
a memory cell array including a plurality of memory cells, a plurality of word lines which control storage operations of the abovementioned plurality of memory cells, and a plurality of dummy word lines which do not contribute to the storage operations of the abovementioned plurality of memory cells; and a guard ring surrounding the abovementioned memory cell array, the abovementioned plurality of dummy word lines being electrically fixed to the abovementioned guard ring.

2. The semiconductor device as claimed in claim 1, characterized in that the abovementioned plurality of word lines and the abovementioned plurality of dummy word lines are disposed as gate electrodes of embedded gate type transistors formed on a semiconductor substrate.

3. The semiconductor device as claimed in claim 1, characterized in that the abovementioned guard ring is formed by means of a diffusion layer surrounding the abovementioned memory cell array.

4. The semiconductor device as claimed in claim 1, characterized in that the abovementioned guard ring is a wiring line guard ring in which the periphery of the abovementioned memory cell array is surrounded by a metal wiring line.

* * * * *